United States Patent
Kaneko

(10) Patent No.: US 8,367,453 B2
(45) Date of Patent: *Feb. 5, 2013

(54) METHOD OF MANUFACTURING SOLAR BATTERY

(75) Inventor: Kazushige Kaneko, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/442,315

(22) Filed: Apr. 9, 2012

(65) Prior Publication Data

US 2012/0196400 A1  Aug. 2, 2012

Related U.S. Application Data

(62) Division of application No. 12/750,324, filed on Mar. 30, 2010, now Pat. No. 8,173,474.

(30) Foreign Application Priority Data

Jun. 26, 2009 (JP) ................................ 2009-152017

(51) Int. Cl.
*H01L 21/00* (2006.01)
(52) U.S. Cl. .......... 438/57; 136/256; 136/258; 136/261; 204/192.23; 204/192.29; 257/E21.269; 438/61; 438/97; 438/98
(58) Field of Classification Search ................ 136/256, 136/258, 261; 204/192.23, 192.29; 257/E21.269; 438/57, 61, 97, 98
See application file for complete search history.

(56) References Cited

U.S. PATENT DOCUMENTS

| 5,828,117 | A | 10/1998 | Kondo et al. |
| 6,372,538 | B1 | 4/2002 | Wendt et al. |
| 6,500,690 | B1 | 12/2002 | Yamagishi et al. |
| 6,554,973 | B2 | 4/2003 | Nakayama |
| 8,173,474 | B2 * | 5/2012 | Kaneko .................... 438/57 |
| 2008/0178932 | A1 * | 7/2008 | Den Boer et al. ......... 136/256 |
| 2009/0194161 | A1 | 8/2009 | Ji et al. |

FOREIGN PATENT DOCUMENTS

| JP | 2001-210845 A | 8/2001 |
| JP | 2001-342555 A | 12/2001 |
| JP | 3419108 B2 | 4/2003 |

OTHER PUBLICATIONS

Explanation of Circumstances Concerning Accelerated Examination for corresponding JP Application No. 2009-152017, filed Dec. 27, 2010, pp. 1-8, Japan.
Japanese Office Action for corresponding JP Application No. 2009-152017, dated Feb. 8, 2011, pp. 1-4, Japan.
Japanese Office Action for corresponding JP Application No. 2009-152017, dated Jun. 7, 2011, pp. 1-4, Japan.
Appeal Decision for JP Application No. 2011-19343, dated Jun. 12, 2012, pp. 1-12, Japan.

* cited by examiner

*Primary Examiner* — Asok K Sarkar
(74) *Attorney, Agent, or Firm* — Ditthavong Mori & Steiner, P.C.

(57) ABSTRACT

When a layered structure of a transparent electrode layer and a metal layer is formed as a back side electrode layer over a surface on a side opposite to a side of incidence of light of a thin film solar battery, a time when formation of the transparent electrode layer is completed and a time when formation of the metal layer is started are made to coincide for one substrate.

4 Claims, 3 Drawing Sheets

METHOD OF MANUFACTURING SOLAR BATTERY

CROSS-REFERENCE TO RELATED APPLICATIONS

The present application is a divisional application of U.S. patent application Ser. No. 12/750,324, filed Mar. 30, 2010, which claims priority to Japanese Patent Application No. 2009-152017, filed on Jun. 26, 2009, the contents of which are incorporated herein by reference in their entireties.

BACKGROUND

1. Technical Field

The present invention relates to a method of manufacturing a solar battery.

2. Related Art

A solar battery is known which uses polycrystalline, microcrystalline, or amorphous silicon. In particular, a solar battery having a structure in which microcrystalline or amorphous silicon thin films are layered has attracted much attention in view of resource consumption, cost reduction, and improved efficiency.

In general, a thin film solar battery is formed by sequentially layering a front side electrode, one or more semiconductor thin film photoelectric conversion units, and a back side electrode over a substrate having an insulating surface. Each solar battery unit is formed by layering a p-type layer, an i-type layer, and an n-type layer from a side of incident light. In addition, a technique is employed in which the back side electrode is formed in a layered structure of a transparent conductive film and a metal film so that the incident light is reflected and the photoelectric conversion efficiency in the semiconductor thin film photoelectric conversion unit is improved.

For example, Japanese Patent No. 3419108 discloses a method of layering a back side electrode layer comprising a transparent conductive metal compound layer and a metal layer over a semiconductor thin film photoelectric conversion unit by moving a substrate in plasma regions where the transparent conductive metal compound and the metal are provided adjacent to each other, from the side of the transparent conductive metal compound to the side of the metal.

When the layered structure of the transparent conductive film and the metal film is employed as the back side electrode, the metal film is formed over the transparent electrode film. In this process, if a wait time from completion of formation of the transparent electrode film to the start of the formation of the metal film is elongated, the charges charged on the substrate during the time when the substrate is exposed to the plasma for sputtering the transparent electrode film may be discharged, and the film quality of the transparent conductive film and the metal film may be degraded because of the relationship between the plasma potential and the substrate potential when the substrate is exposed to the plasma for sputtering the metal film.

In addition, if the wait time after the substrate has passed the plasma for sputtering the transparent electrode film and until the substrate reaches the plasma for sputtering the metal film is elongated, it is not possible to take advantage of the heating of the substrate by plasma of the sputtering during the formation of the transparent electrode film, and the temperature of the substrate is reduced before the formation of the metal film.

In particular, in an inline-type manufacturing device in which the substrate is moved and passed through a plasma for sputtering the transparent electrode film and further through a plasma for sputtering the metal film, an in-plane distribution of the substrate temperature would be caused in one substrate between a region which passes through the plasma of the transparent electrode film earlier and a region which passes through the plasma later. Such an in-plane distribution affects the characteristics of the formed transparent electrode film and the formed metal film, and may increase non-uniformity on the surface of the film or may reduce the film quality.

SUMMARY

According to one aspect of the present invention, there is provided a method of manufacturing a solar battery in which a thin film solar battery is formed over a substrate, wherein, when a layered structure of a transparent electrode layer and a metal layer is formed as a back side electrode layer over a surface on a side opposite to a side of incident light of the thin film solar battery, a time when formation of the transparent electrode layer is completed and a time when formation of the metal layer is started are made to coincide for one substrate.

BRIEF DESCRIPTION OF THE DRAWINGS

A preferred embodiment of the present invention will be described in further detail based on the following drawings, wherein.

DETAILED DESCRIPTION

Figure 1:
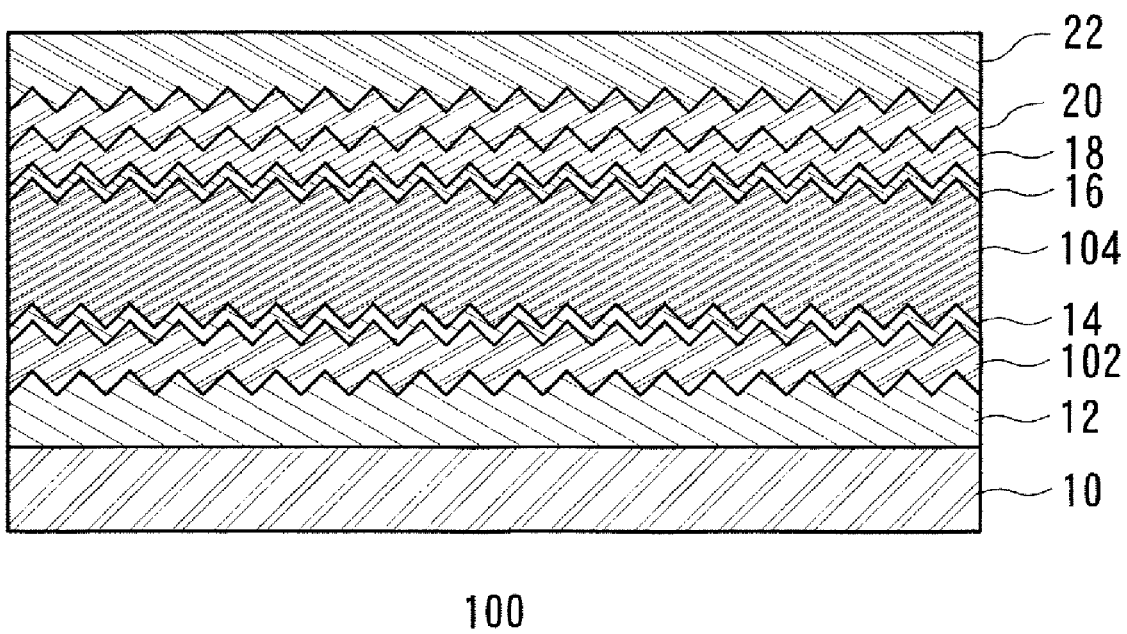
FIG. 1 is a diagram showing an example structure of a solar battery.

FIG. 1 is a cross sectional diagram showing an example structure of a tandem-type solar battery 100. The tandem-type solar battery 100 has a structure in which, with a substrate 10 as a light incident side, a front side electrode film 12, an amorphous silicon (a-Si) unit (photoelectric conversion unit) 102 functioning as a top cell and having a wide band gap, an intermediate layer 14, a microcrystalline silicon (μc-Si) unit (photoelectric conversion unit) 104 functioning as a bottom cell and having a narrower band gap than the a-Si unit 102, a first back side electrode layer 16, a second back side electrode layer 18, a filler 20, and a back sheet 22 are layered from the light incident side.

For the substrate 10, for example, a material which is transmissive at least in a visible light wavelength region such as a glass substrate and a plastic substrate is used. The front side electrode film 12 is formed over the substrate 10. The front side electrode film 12 is preferably formed by combining at least one or a plurality of transparent conductive oxides (TCO) in which tin (Sn), antimony (Sb), fluorine (F), aluminum (Al), etc. is contained in tin oxide ($SnO_2$), zinc oxide (ZnO), indium tin oxide (ITO), etc. In particular, zinc oxide (ZnO) is preferable because it has a high light transmittance, a low resistivity, and a superior plasma enduring characteristic. The front side electrode film 12 is formed, for example, through sputtering or the like. A thickness of the front side electrode film 12 is preferably in a range of greater than or equal to 500 nm and less than or equal to 5000 nm. In addition, it is preferable to provide projections and depressions having a light confinement effect on the surface of the front side electrode film 12.

Silicon-based thin films, that is, a p-type layer, an i-type layer, and an n-type layer, are layered in this order over the front side electrode film 12, to form the a-Si unit 102. The p-type layer and the n-type layer include a single layer or a plurality of layers of a semiconductor thin film such as an amorphous silicon thin film, an amorphous silicon carbide thin film, a microcrystalline silicon thin film, and a microcrystalline silicon carbide film doped with a p-type dopant or an n-type dopant. An amorphous silicon thin film is employed as the i-type layer which forms a power generation layer of the a-Si unit 102. The a-Si unit 102 can be formed by plasma CVD in which a film is formed by producing a plasma of material gas in which silicon-containing gas such as silane ($SiH_4$), disilane ($Si_2H_6$), and dichlorsilane ($SiH_2Cl_2$), carbon-containing gas such as methane ($CH_4$), p-type dopant-containing gas such as diborane ($B_2H_6$), n-type dopant-containing gas such as phosphine ($PH_3$), and dilution gas such as hydrogen ($H_2$) are mixed.

For example, the a-Si unit 102 is formed by layering a p-type microcrystalline silicon layer (p-type µc-Si:H) which is doped with boron and which has a thickness of greater than or equal to 5 nm and less than or equal to 50 nm, an i-type amorphous silicon layer (i-type α-Si:H) which is not doped with any dopant and which has a thickness of greater than or equal to 100 nm and less than or equal to 500 nm, and an n-type microcrystalline silicon layer (n-type µc-Si:H) which is doped with phosphorus and which has a thickness of greater than or equal to 5 nm and less than or equal to 50 nm.

The intermediate layer 14 is formed over the a-Si unit 102. The intermediate layer 14 is preferably formed with a transparent conductive oxide (TCO) such as zinc oxide (ZnO), and silicon oxide (SiOx). In particular, it is preferable to use zinc oxide (ZnO) or silicon oxide (SiOx) in which magnesium (Mg) is contained. The intermediate layer 14 is formed, for example, through sputtering or the like. The thickness of the intermediate layer 14 is preferably in a range of greater than or equal to 10 nm and less than or equal to 200 nm. Alternatively, the intermediate layer 14 may be omitted.

The µc-Si unit 104 is formed over the intermediate layer 14 by sequentially layering the silicon-based thin films, that is, the p-type layer, the i-type layer, and the n-type layer. The p-type layer and the n-type layer include a single layer or a plurality of layers of a semiconductor thin film such as an amorphous silicon thin film, an amorphous silicon carbide thin film, a microcrystalline silicon thin film, and a microcrystalline silicon carbide film doped with a p-type dopant or an n-type dopant. A microcrystalline silicon thin film is employed as the i-type layer which forms a power generation layer of the µc-Si unit 104. The µc-Si unit 104 can be formed through plasma CVD in which a film is formed by forming a plasma of a material gas in which silicon-containing gas such as silane ($SiH_4$), disilane ($Si_2H_6$), dichlorsilane ($SiH_2Cl_2$), carbon-containing gas such as methane ($CH_4$), p-type dopant-containing gas such as diborane ($B_2H_6$), n-type dopant-containing gas such as phosphine ($PH_3$), and dilution gas such as hydrogen ($H_2$) are mixed.

For example, the µc-Si unit 104 is formed by layering a p-type microcrystalline silicon layer (p-type µc-Si:H) which is doped with boron and which has a thickness of greater than or equal to 5 nm and less than or equal to 50 nm, an i-type microcrystalline silicon layer (i-type µc-Si:H) which is not doped with any dopant and which has a thickness of greater than or equal to 500 nm and less than or equal to 5000 nm, and an n-type microcrystalline silicon layer (n-type µc-Si:H) which is doped with phosphorus and which has a thickness of greater than or equal to 5 nm and less than or equal to 50 nm.

A layered structure of the first back side electrode layer 16 and the second back side electrode layer 18 is formed over the µc-Si unit 104. For the first back side electrode layer 16, a transparent conductive oxide (TCO) such as tin oxide ($SnO_2$), zinc oxide (ZnO), and indium tin oxide (ITO) is used. For the second back side electrode layer 18, a reflective metal such as silver (Ag) and aluminum (Al) is used. The first back side electrode layer 16 and the second back side electrode layer 18 are preferably formed to a total thickness of approximately 500 nm. In addition, it is preferable to provide projections and depressions for improving the light confinement effect on at least one of the first back side electrode layer 16 and the second back side electrode layer 18. The manufacturing method of the first back side electrode layer 16 and the second back side electrode layer 18 will be described later.

Moreover, the surface of the second back side electrode layer 18 is covered by the back sheet 22 with the filler 20. For the filler 20 and the back sheet 22, a resin material such as EVA and polyimide may be used. With this structure, intrusion of moisture or the like into the power generation layer of the tandem-type solar battery 100 may be prevented.

Figure 2:
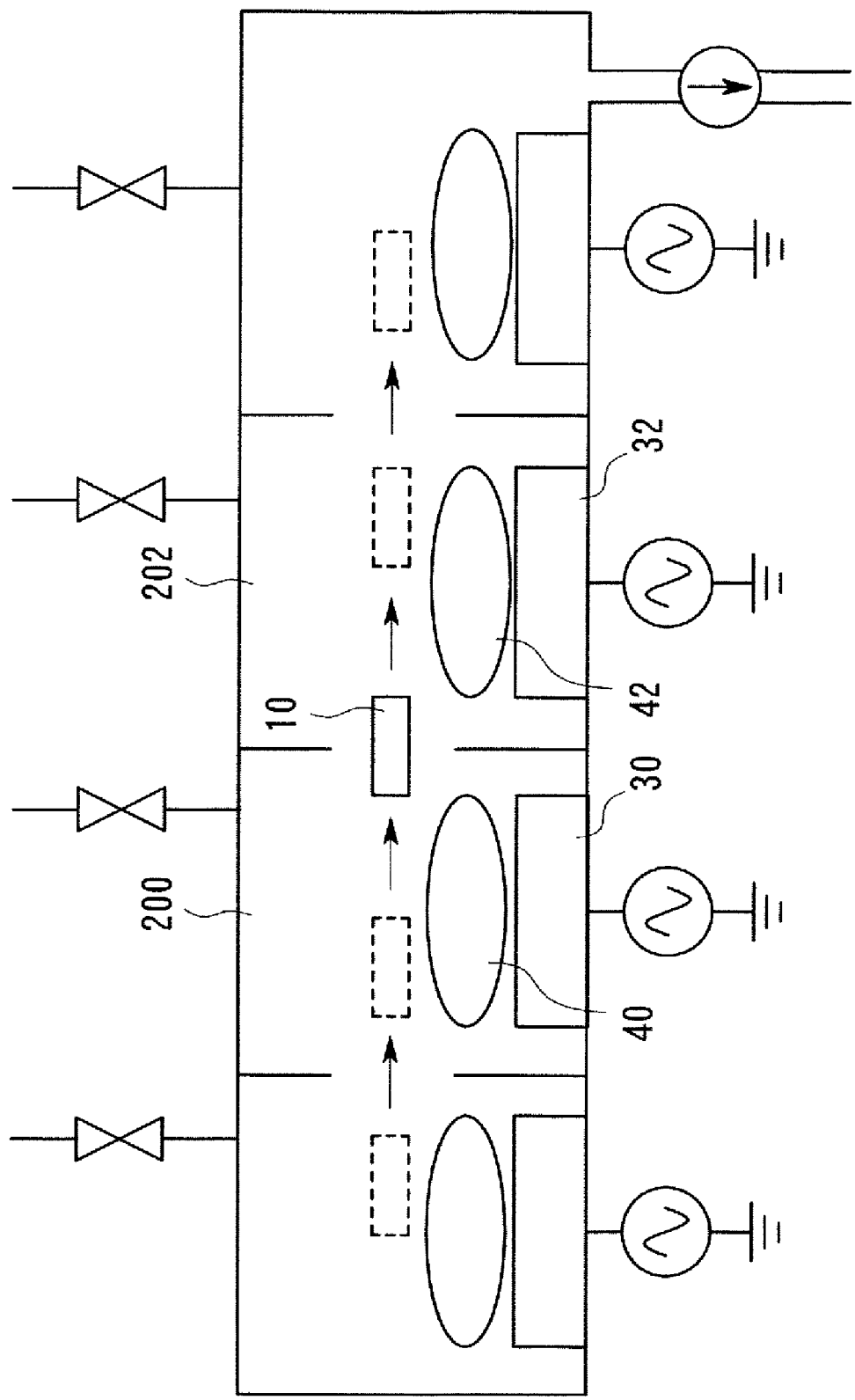
FIG. 2 is a diagram for explaining a manufacturing method of a back side electrode of a solar battery in a preferred embodiment of the present invention.

A manufacturing method of the first back side electrode layer 16 and the second back side electrode layer 18 in the present embodiment will now be described with reference to FIGS. 2 and 3.

In a manufacturing method of the first back side electrode layer 16 and the second back side electrode layer 18 in the present embodiment, an inline-type sputtering device is used. In the inline-type sputtering device, while the substrate 10 is moved through a reaction chamber 200 for the first back side electrode layer 16, and through a reaction chamber 202 for the second back side electrode layer 18 in order, a target 30 of the transparent electrode film of the first back side electrode layer 16 to be formed and a target 32 of the metal film 32 of the second back side electrode layer 18 to be formed are sputtered with plasmas, and the films are formed.

The inline-type sputtering device may further comprise a reaction chamber for forming a back side electrode layer of two or more layers. For example, the transparent electrode film which will become the first back side electrode layer 16 may have a layered structure of zinc oxide (Mg:ZnO) in which magnesium (Mg) is contained in zinc oxide (ZnO). Alternatively, the metal film which will become the second back side electrode layer 18 may have a layered structure of silver (Ag) and titanium (Ti). By employing such a multilayer layered structure, it is possible to improve the reflectivity at the back side of the solar battery, and improve the power generation efficiency of the solar battery.

In this description, the method is described assuming that the reaction chamber 200 is a reaction chamber in which the last film of the transparent electrode film for the first back side electrode layer 16 is formed and the reaction chamber 202 is a reaction chamber in which the first film of the metal film for the second back side electrode layer 18 is formed.

The reaction chambers 200 and 202 comprise sputtering devices. For the sputtering device, direct current (DC) sputtering, high frequency sputtering, magnetron sputtering, etc. may be employed. After the air in the reaction chambers 200 and 202 has been discharged by vacuum pumps, gas such as argon gas, a mixture gas of argon gas and oxygen gas, etc. is introduced from a gas supply system. Then, electric power is introduced to produce plasmas 40 and 42 of the reaction gas, the targets 30 and 32 are sputtered, and the transparent electrode film and the metal film are formed over the substrate 10 which is being transported.

Table 1 shows an example of film formation conditions when a film of zinc oxide (ZnO) or zinc oxide in which magnesium (Mg) is contained (Mg:ZnO) is formed as the first back side electrode layer 16. Table 2 shows an example of film formation conditions when a film of silver (Ag) is formed as the second back side electrode layer 18. Table 2 also shows an example of film formation conditions when a film of titanium (Ti) is formed over silver (Ag) as the second back side electrode layer 18.

TABLE 1

| LAYER | SUBSTRATE TEMPERATURE (° C.) | GAS FLOW RATE (sccm) | REACTION PRESSURE (Pa) | DC POWER (kW) |
|---|---|---|---|---|
| ZnO | 60~120 | Ar: 80~200 O2: 0~3 | 0.4~0.7 | 5~20 |
| Mg:ZnO | 60~120 | Ar: 80~200 O2: 0~3 | 0.4~0.7 | 5~20 |

TABLE 2

| LAYER | SUBSTRATE TEMPERATURE (° C.) | GAS FLOW (sccm) | REACTION PRESSURE (Pa) | DC POWER (kW) |
|---|---|---|---|---|
| Ag | 60~120 | Ar: 80~200 O2: 0 | 0.4~0.7 | 5~20 |
| Ti | 60~120 | Ar: 80~200 O2: 0 | 0.4~0.7 | 5~20 |

Figure 3:
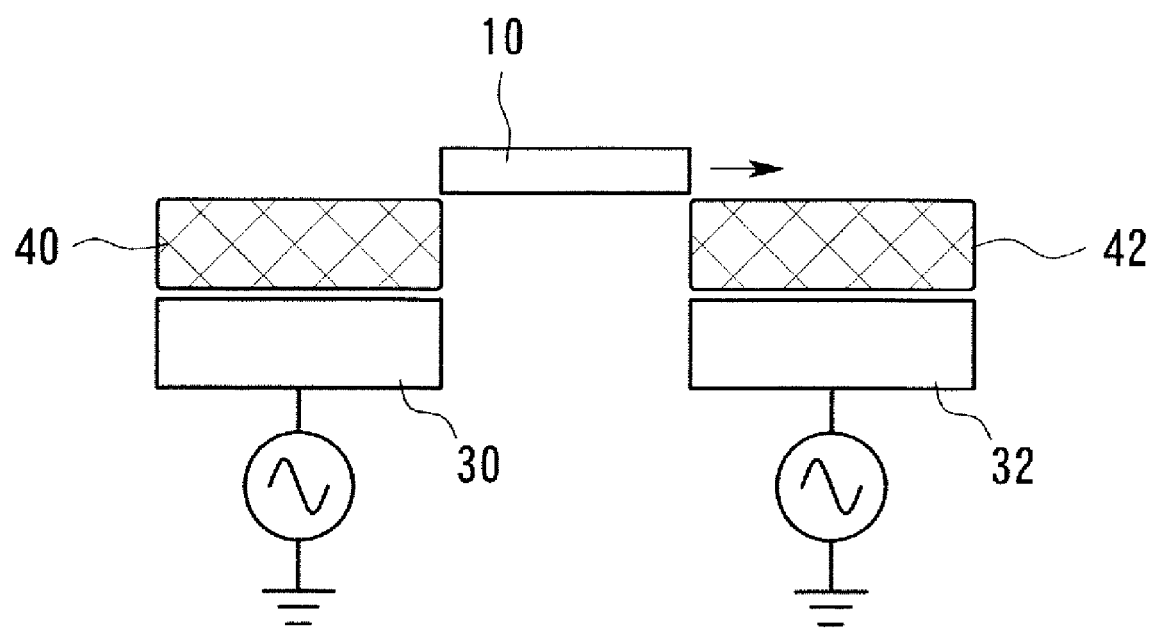
FIG. 3 is a diagram for explaining a manufacturing method of a back side electrode of a solar battery in a preferred embodiment of the present invention.

In the present embodiment, as shown in FIG. 3, a time when the formation of the transparent electrode film which is lastly formed as the first back side electrode layer 16 is completed and a time when the formation of the metal film which is first formed as the second back side electrode layer 18 is started are made to coincide for one substrate 10. In other words, the sputtering device is configured in such a manner that the time when the substrate 10 passes through and exits the plasma for sputtering the transparent electrode film which is lastly formed as the first back side electrode layer 16 is made to coincide with a time when the substrate 10 enters the plasma for sputtering for forming the metal film which is first formed as the second back side electrode layer 18.

In this process, it is preferable that the times completely coincide with each other. However, the present invention is not limited to such a configuration, and it is preferable that the wait time from the time of completion of the formation of the transparent electrode film which is lastly formed as the first back side electrode layer 16 to the time of the start of the formation of the metal film which is first formed as the second back side electrode layer 18 is at most 10 seconds or shorter.

With such a process, there will be almost no wait time from the completion of the formation of the transparent electrode film and the start of the formation of the metal film, and the charges charged on the substrate while the substrate is exposed to the plasma for the transparent electrode film are not discharged and the substrate is exposed to the next plasma for the metal film. Thus, the discharge of charges charged on the substrate can be inhibited compared to the method of the related art, and reduction of the film quality of the transparent conductive film and the metal film because of the relationship between the plasma potential and the substrate potential can be inhibited.

In addition, the wait time from the completion of the formation of the transparent electrode as the first back side electrode layer 16 to the start of the formation of the metal film as the second back side electrode layer 18 does not occur, and thus the heated state of the substrate 10 by the plasma 40 during the formation of the transparent electrode film can be maintained and the heating of the substrate 10 by the plasma 42 during the formation of the metal film can be immediately started. Therefore, the degree of decrease in temperature of the substrate 10 from the completion of the formation of the transparent electrode film to the start of the formation of the metal film can be reduced. Moreover, in one substrate 10, the in-plane distribution of the temperature in the region which passes the plasma of the material of the transparent electrode film earlier and the region which passes the plasma later can be reduced compared to the method of related art, and thus the non-uniformity in the plane of the film can be inhibited and the film quality can be improved.

In particular, when a film of zinc oxide in which magnesium (Mg) is contained (Mg:ZnO) is to be formed as the first back side electrode layer 16, if the temperature distribution in the plane of the substrate 10 is increased, the temperature of the region which is exposed to the plasma and in which the film is being formed is also reduced, the replacement in a site of zinc (Zn) by magnesium (Mg) in the film formation region does not tend to occur, and a desired characteristic may not be obtained. In the present embodiment, the in-plane temperature distribution of the substrate 10 during the film formation can be reduced, and thus doping of magnesium (Mg) into zinc oxide (ZnO) can be suitably executed.

The present embodiment has been described exemplifying a manufacturing method of a back side electrode of the tandem-type solar battery 100 in which the a-Si unit 102 and the μc-Si unit 104 are layered. The present invention, however, is not limited to such a configuration, and may be applied to any back side electrode of a thin film solar battery. For example, the present invention may be applied to a back side electrode of a solar battery having a single a-Si unit 102 or a single μc-Si unit 104.

What is claimed is:

1. A method of manufacturing a solar battery in which a thin film solar battery is formed over a light-transmitting substrate, comprising:
    forming a transparent electrode layer composed of zinc oxide on a side opposite to a side of incident light of the thin film solar battery; and
    forming, after forming the transparent electrode layer, a metal layer composed of silver over the side opposite to the side of incident light, to form a layered structure of the transparent electrode and the metal layer, wherein
    a time when formation of the transparent electrode layer is completed and a time when formation of the metal layer is started are made to coincide for one substrate while the substrate is moved between a film formation chamber for forming the transparent electrode layer and a film formation chamber for forming the metal layer, the film formation chambers being provided separately from each other.

2. The method of manufacturing the solar battery according to claim 1, wherein when the layered structure of the transparent electrode layer and the metal layer is formed, formation of the metal layer is started within 10 seconds from completion of the formation of the transparent electrode layer for one substrate.

3. The method of manufacturing the solar battery according to claim 1, wherein the zinc oxide is doped with magnesium.

4. The method of manufacturing the solar battery according to claim 2, wherein the zinc oxide is doped with magnesium.

* * * * *